United States Patent

Retzer et al.

Patent Number: 5,465,404
Date of Patent: Nov. 7, 1995

[54] COMMUNICATIONS RECEIVER WITH AN ADAPTIVE SQUELCH SYSTEM

[75] Inventors: Michael H. Retzer, Palatine; Alan D. Muehlfeld, Mount Prospect, both of Ill.

[73] Assignee: Motorola, Inc., Schaumburg, Ill.

[21] Appl. No.: 10,690

[22] Filed: Jan. 29, 1993

[51] Int. Cl.[6] ........................................... H04B 1/10
[52] U.S. Cl. ....................... 455/220; 455/225; 375/217; 375/351
[58] Field of Search ............................... 455/212, 213, 455/218–225; 375/104, 217, 351

[56] References Cited

U.S. PATENT DOCUMENTS

| | | | |
|---|---|---|---|
| 3,584,304 | 6/1971 | Casterline et al. | 455/225 |
| 3,614,621 | 10/1971 | Chapman et al. | 455/220 |
| 3,851,253 | 11/1974 | Eastmond | 455/220 |
| 3,927,376 | 12/1975 | Ferrie | 455/218 |
| 4,020,421 | 4/1977 | Elder et al. | 455/225 |
| 4,344,175 | 8/1982 | Leslie | 455/218 |
| 4,411,021 | 10/1983 | Yoakum | 455/222 |
| 4,430,742 | 2/1984 | Milleker et al. | 455/38.2 |
| 4,663,765 | 5/1987 | Sutphin et al. | 375/104 |
| 4,972,510 | 11/1990 | Guizerix et al. | 455/218 |
| 5,151,922 | 9/1992 | Weiss | 375/104 |

FOREIGN PATENT DOCUMENTS 0175230  10/1984  Japan ................................ 455/220

Primary Examiner—Reinhard J. Eisenzopf
Assistant Examiner—Andrew Faile
Attorney, Agent, or Firm—Frank M. Scutch, III

[57] ABSTRACT

A wireless communications receiver having an adaptive squelch system and operable in multiple states including a receiver (11) that provides a received signal when operating in a clear (unscrambled) state and when operating in a secure (scrambled) state; a squelch function (13) that generates an unsquelch signal when the received signal satisfies a quality level; and a controller (15) that sets the quality level to a predetermined level that corresponds to the receiver operating state.

7 Claims, 2 Drawing Sheets

COMMUNICATIONS RECEIVER WITH AN ADAPTIVE SQUELCH SYSTEM

FIELD OF THE INVENTION

This invention relates generally to wireless communications receivers and more particularly to such receivers including squelch systems.

BACKGROUND OF THE INVENTION

Wireless communications receivers and squelch functions are well known in the art. Squelch functions generally allow a receiver to selectively pass on whatever signal it is receiving to a user, often in an audible format. Viewed from the opposite perspective, when the receiver is not receiving a desirable signal the receiver will be squelched and thus avoid the user annoyance or unreliable reception associated with a radio signal that is too weak or distorted to be useful.

Because of certain technical limitations and subjective user requirements squelch functions may have various characteristics and features. Among such characteristics and features, typically, are a squelch sensitivity, a tight squelch limit, and a unit specific, often user determined, squelch threshold setting. The squelch sensitivity represents the lowest received signal quality that the squelch function can reliably identify as desirable. Practically speaking signal quality is usually synonymous with signal strength for fixed received signal characteristics, including for example modulation parameters.

Similarly, the tight squelch limit represents the opposite end of the spectrum of received signal quality. It will be established by either the technical limitations of the squelch function as a quality level just slightly less than the best signal quality the squelch function can discern or alternatively a quality level beyond which there is little if any debate about the desirability of the signal. In the latter case the tight squelch limit is established to make sure the user does not miss a desirable received signal regardless of the squelch threshold setting. As this suggests the squelch threshold setting is that quality level which when exceeded by the received signal quality results in the squelch function causing the receiver to un-squelch or open. Ordinarily this setting lies somewhere between the squelch sensitivity and tight squelch limit and may depend on any number of imponderables such as subjective user requirements or the typical operating environment of the unit, etc.

While the above was generally acceptable it unfortunately includes a perhaps historically but no longer justified supposition that received signal characteristics which affect squelch performance parameters are largely invariant. Such characteristics may include various modulation parameters like deviation, bandwidth, modulation energy distribution vs frequency and the like. A given receiver subjected to in turn an analog voice transmission, a data communications, a secured analog voice transmission, and etc. will encounter a number of possibly critical variations in such characteristics. Increasing demands placed on today's and likely tomorrow's systems and equipment promises to make variations in such characteristics the role rather than the exception.

The net of all this is that unlike current receiver squelch functions, when modulation parameters change optimum squelch characteristics should also change. This is particularly important for the tight squelch limit. If this characteristic is not modified to correspond with a modulation change the squelch threshold setting can be higher than the best received signal quality that a squelch function is able to discern. This ultimately may result in a user of the receiver missing an undeniably acceptable received signal.

Clearly them is a need for a communications receiver with an adaptive squelch system wherein squelch characteristics vary in accordance with received signal characteristics.

SUMMARY OF THE INVENTION

The aforementioned needs among others are addressed by teaching a wireless communications receiver having an adaptive squelch system and operable in multiple states. The apparatus includes a receiver for providing a received signal when operating in a first state and when operating in a second state; a squelch function, coupled to the receiver for providing an unsquelch signal when the received signal satisfies a quality level; and a controller, coupled to the squelch function, for setting the quality level to a first predetermined level when the receiver is operating in the first state and setting the quality level to a second predetermined level when the receiver is operating in the second state.

BRIEF DESCRIPTION OF THE DRAWINGS

The features of the present invention which are believed to be novel are set forth with particularity in the appended claims. The invention, itself, however together with further advantages thereof, may best be understood by reference to the accompanying drawings in which:

DETAILED DESCRIPTION OF A PREFERRED EMBODIMENT

Figure 1:
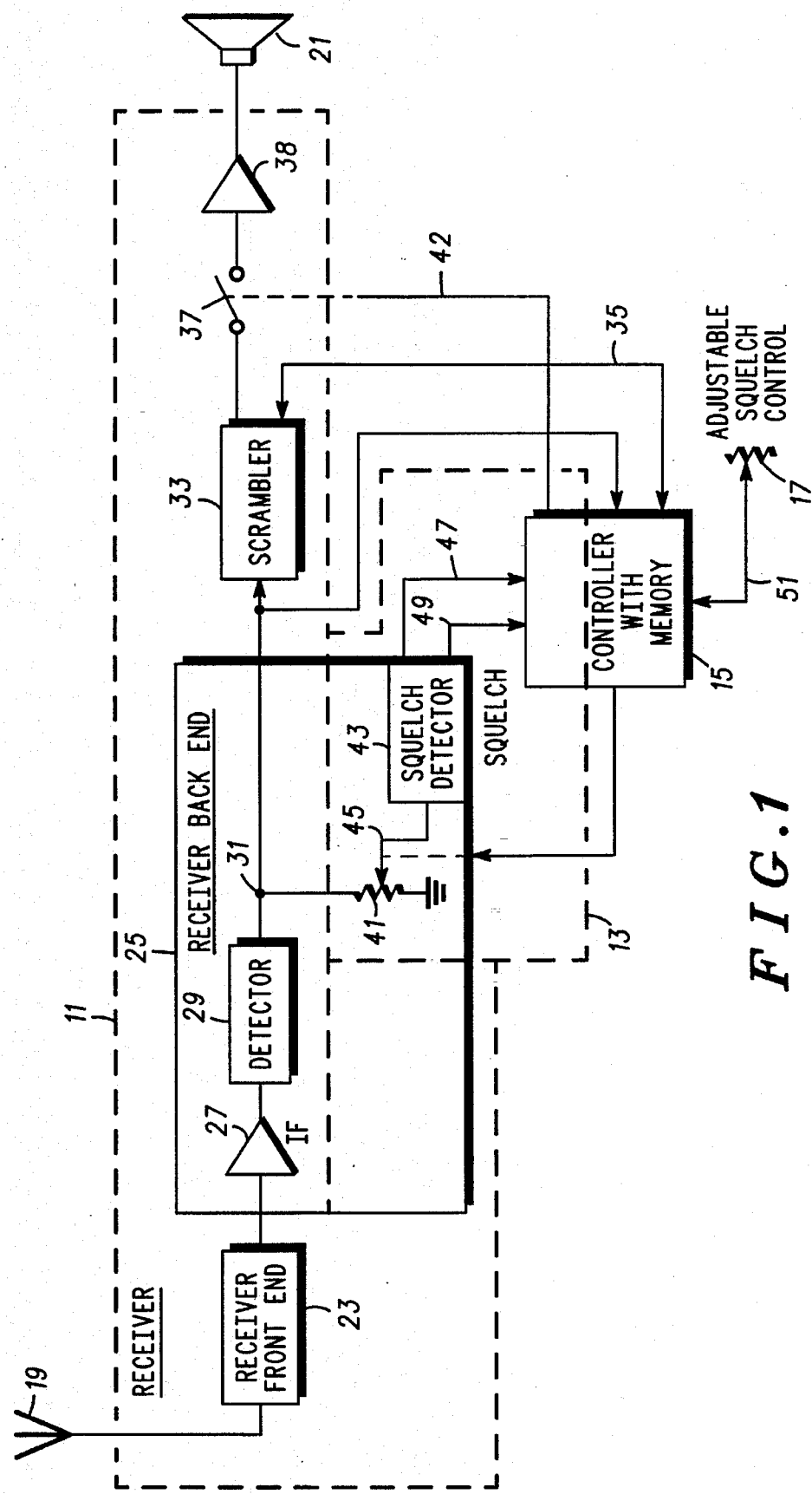
FIG. 1 is a block diagram of a wireless communications receiver constructed in accordance with one embodiment of the present invention.

Referring to FIG. 1, a wireless communications receiver having an adaptive squelch system is depicted as including, a receiver (11), a squelch function (13), a controller (15) with memory, and an adjustable squelch control (17). The receiver is connected to an antenna (19) and driving a speaker (21).

The antenna (19) is coupled to a receiver front end (23) that may include such elements as a preselector, a RF amplifier, and a mixer all arranged to provide a radio signal at an IF frequency. The receiver front end is coupled to the receiver back end (25) at an IF section (27) that includes, for example, IF gain stages and IF filters. The IF section provides a desired radio signal including modulation representing, preferably, voice, but alternatively data modulation or signals to a detector (29) that, in turn, demodulates the desired radio signal and provides a received signal with or representative of the aforementioned modulation at a output (31).

The output (31) is coupled, preferably to a scrambler (33), the controller (15), and the squelch function (13). The scrambler (33) is an optional feature installed in some radios to allow a form of secure communications. This form of secure communications is typically characterized by modulation that has been systematically corrupted in some predetermined fashion by, for example, selective frequency inversion prior to transmission. Therefore the receiver must descramble the received signal to render it useful when the signal was transmitted in a scrambled form. Since the scrambler (33) is optional it may or may not be present in a particular receiver (11). As implied above, even when the scrambler (33) is present, the received signal at the output (31) may or may not be scrambled.

From this it is clear that the receiver (11), including the scrambler (33) must be arranged to operate in at least a first state, corresponding, for example, to a clear or un-scrambled state, and a second state, corresponding, for example, to a scrambled or secure state. Controlling the operating state, in a preferred embodiment is accomplished by providing an indication of the presence of the scrambler (33) to the controller (15) at a connection path (35). Alternatively this indication may be stored in the memory of the controller (15). Further, in the preferred embodiment, the presence of a scrambled received signal is indicated by a predetermined data pattern at the output (31) just prior to the scrambled received signal. The controller (15) detects the predetermined data pattern and enables the scrambler (33) by way of the connection path (35). Alternatively, the scrambler (33) may detect the predetermined data pattern, notify the controller (15) via the connection path (35), and independently initiate descrambling of the received signal. In any event the received signal will be coupled in appropriate form by the scrambler (33) or a bypass circuit when the scrambler (33) is not present, to a squelch gate (37). When the receiver (11) is un-squelched (squelch gate (37) enabled) the signal at the squelch gate (37) is then coupled to an audio amplifier (39) for application to the speaker (21).

The received signal at the output (31) is coupled to the squelch function (13) at a controllable attenuator (41). The squelch function (13) operates to provide an un-squelch signal at a output (42) when the received signal satisfies a quality level. The controllable attenuator (41) attenuates the received signal and applies an attenuated received signal to a squelch detector (43) at a input (45). In a preferred embodiment the controllable attenuator (41) and the squelch detector (43) are included in an integrated circuit with the IF section (27) and the detector (29). The squelch detector (43) selectively compares the attenuated received signal energy to a detector threshold and when the detector threshold is satisfied generates a fast squelch (FSQ) signal at an output (47) and then subsequently a carder squelch (CSQ) signal at an output (49).

The FSQ signal and the CSQ signal are coupled to the controller (15) acting in it's role as a part of the squelch function (13). These two signals together with, for example, any selective signalling information from the output (31) or any other relevant operational information are combined by the controller (15) to provide the un-squelch signal at the output (42). The output (42) is coupled to and controls the squelch gate (37).

The controller (15) also plays a central role in setting a quality level that the received signal quality must satisfy before the un-squelch signal is provided at the output (42). The controller (15) is coupled to and establishes the amount of attenuation of the controllable attenuator (41) and thus the level of the attenuated received signal at the input (45) of the squelch detector (43). From above, the attenuated received signal level, all else remaining the same, will effect whether the detector threshold is satisfied and thus ultimately whether the un-squelch signal is provided at the output (42). For a given set of circumstances including received signal characteristics, the receiver (11) architecture, and the squelch detector (43) configuration the received signal quality will be related to the level of the attenuated received signal. Thus the controller (15), by setting the controllable attenuator sets the quality level to which the received signal quality is compared to determine whether to provide the un-squelch signal.

For example, in a preferred embodiment, an FM receiver and an FM squelch function are employed. As is generally understood in the FM systems art, the amplitude of the received signal is largely invariant regardless of signal quality. However the amplitude or power of the received signal in a given frequency band may vary in a relatively predictable manner with the received signal quality. Such variation may be advantageously used by the squelch function (13) to compare the quality level or desired signal quality or squelch threshold to the actual or assessed received signal quality.

By selecting a frequency band at higher modulation frequencies, for example, 4–5 kHz it may be observed that as the signal quality improves the energy in this band decreases, at least to a limit determined by either modulation signal components or other practical limitations. This limit ordinarily determines and is representative of what the tight squelch limit should be for a particular receiver in particular circumstances. For the squelch function (13) discussed herein, a reduction in the attenuation of the controllable attenuator (41) would increase the level of the attenuated received signal at the input (45) and hence require the received signal to satisfy a higher quality level before the energy in the 4–5 kHz band was reduced a sufficient amount to satisfy the detector threshold. Note the above presupposed that such reduction was possible, that is the aforementioned tight squelch limit was not set to a higher level than the detector threshold.

As the characteristics of the received signal change the tight squelch limit will also vary. For example, the limit will be lower for clear (unscrambled) modulation than for secure (scrambled) modulation, some data modulation, or modulation encountered under such circumstances as scanning various frequencies for activity. If the desired signal quality or squelch threshold has been set by, for example, a user via the adjustable squelch control (17) as coupled to the controller (15) at a input (51), to a quality level that corresponds to an energy level in the 4–5 kHz frequency band that is below the tight squelch limit for the present circumstances the squelch function (13) will never generate the un-squelch signal and the user may miss a perfectly acceptable message.

The instant invention may be used to resolve the problems that may otherwise be encountered due to such circumstances. In the instant invention the controller (15), by varying the controllable attenuator (41), sets a quality level to a first predetermined level when the receiver is operating in a first state and sets the quality level to a second predetermined level when the receiver is operating in a second state thereby assuring the quality level does not exceed the receiver operating state dependent tight squelch limit and thus further that desirable received signals are not missed or ignored.

Figure 2:
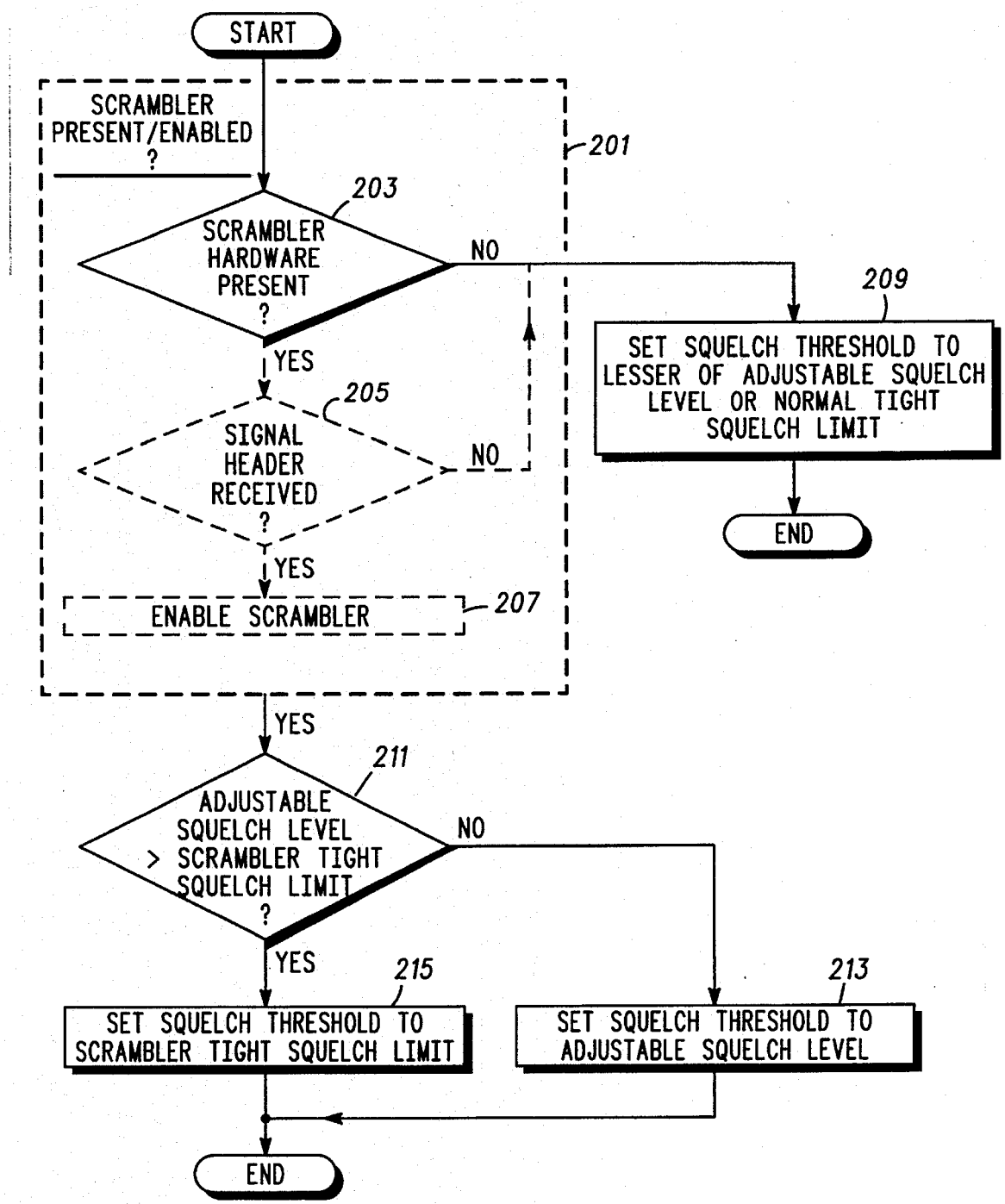
FIG. 2 is a process flow diagram illustrative of the process executed by the FIG. 1 wireless communications receiver.

This will be further clarified by the following description that refers to FIG. 2. FIG. 2 is a flow chart of a process executed by a processor, not specifically shown but included with the controller (15), in accordance with the instant invention. Initially the controller (15) determines whether the scrambler (33) is present and enabled at step (201). If the scrambler (33) is present, at step (203), the controller (15) determines whether the scrambler (33) is or should be enabled by determining if the predetermined header is present in the received signal at step (205). If the predetermined header is present the scrambler (33) is enabled at step (207). Alternatively, if the scrambler (33) is not present at step (203) or the header is not present at step (205) the squelch threshold or quality level is set, by the controller (15), to the lesser of the adjustable squelch level or the "normal" tight squelch limit at step (209).

When the controller (15) determines that the scrambler (33) is present and enabled at step (201), the adjustable squelch level is compared to the predetermined scrambler tight squelch limit at step (211). If the adjustable squelch level is less than the scrambler tight squelch limit the controller (15) sets the squelch threshold to the adjustable squelch level at step (213). If the adjustable squelch level is greater than the scrambler tight squelch limit at step (211) the squelch threshold is set to the scrambler tight squelch limit at step (215).

Those skilled in the art will recognize that the process of FIG. 2 may be readily extended to other operational states of the receiver (11), such as receiving a data signal or scanning a number of frequencies, etc, where it is recognized that the relevant tight squelch limit varies from the "normal" tight squelch limit and such extension may be accomplished either singularly or in combination with more than two operational states. The instant invention may advantageously be utilized to provide a squelch function (13) that is readily adaptable to varying operating states. Such adaptation can eliminate the all to often situation where a wireless communications receiver user misses a perfectly reliable message solely because the receiver (11) has not been un-squelched.

What is claimed is:

1. A wireless communications receiver having an adaptive squelch system and operable in multiple states, comprising:

a receiver for providing a first received signal when operating in a first state and a second received signal when operating in a second state, wherein the first received signal and the second received signal have different characteristics;

means for providing a threshold level and providing a first unsquelch signal and a subsequent second unsquelch signal when the first received signal or the second received signal satisfies a quality level; and a squelch controller coupled to the squelch circuit for receiving the first unsquelch signal and the second unsquelch signal and for setting the quality level of the squelch circuit based on the first unsquelch signal and the second unsquelch signal to a first predetermined level when the receiver is operating in the first state and setting the quality level to a second predetermined level when the receiver is operating in the second state.

2. The apparatus of claim 1 wherein the first unsquelch signal is a fast squelch signal for controlling squelch parameters.

3. The apparatus of claim 2 wherein the second unsquelch signal is a carrier squelch signal for controlling squelch parameters.

4. The wireless communications receiver of claim 1 wherein the second state includes providing the second received signal with secured modulation.

5. The wireless communications receiver of claim 1 wherein the second state includes providing the second received signal with secured modulation and the first state includes providing the first received signal with clear modulation.

6. The wireless communications receiver of claim 1 wherein the squelch controller determines when the receiver means operates in the first state and when the receiver means operates in the second state.

7. The wireless communications receiver of claim 6 wherein the second state includes providing the second received signal with secured modulation and the first state includes providing the first received signal with clear modulation.

* * * * *